United States Patent [19]
van der Wagt

[11] Patent Number: 5,646,884
[45] Date of Patent: Jul. 8, 1997

[54] ELECTRICAL DATA STORAGE DEVICE

[75] Inventor: Jan Paul Antoni van der Wagt, Dallas, Tex.

[73] Assignee: Texas Instruments Incorporated, Dallas, Tex.

[21] Appl. No.: 672,467

[22] Filed: Jun. 26, 1996

Related U.S. Application Data

[60] Provisional application No. 60/000,800, Aug. 5, 1995.
[51] Int. Cl.$^6$ .................................................. G11C 5/06
[52] U.S. Cl. ........................... 365/175; 365/71; 365/72; 365/168
[58] Field of Search ........................... 365/175, 168, 365/71, 72, 105

[56] References Cited

U.S. PATENT DOCUMENTS

| | | | |
|---|---|---|---|
| 5,267,193 | 11/1993 | Lin | 365/175 |
| 5,280,445 | 1/1994 | Shieh et al. | 365/175 |
| 5,390,415 | 2/1995 | Nakasha et al. | 365/175 |
| 5,535,156 | 7/1996 | Levy et al. | 365/175 |

OTHER PUBLICATIONS

Z. C. Tan et al., "Series–Connected Tunnel–Diode–Scaler Design Considerations," *Electronic Engineering*. Oct. 1967, pp. 624–629.

*Primary Examiner*—David C. Nelms
*Assistant Examiner*—Vu A. Le
*Attorney, Agent, or Firm*—Christopher L. Maginniss; James C. Kesterson; Richard L. Donaldson

[57] ABSTRACT

A data storage device consisting of at least two series connected resonant tunneling diodes (RTD1, RTD2) with capacitors (C1, C2) coupled thereacross. By coupling a time varying voltage V(t) across the series connected diodes, one the diodes can be selectively switched from a state below its peak current to a stable point above its peak current. The diode which switches state is controlled by the slope of the time varying voltage V(t). Cells consisting of at least two or more resonant tunneling diodes may be connected in series and can store up to $2^N$ binary states where N is the number of resonant tunneling diodes in the cell.

25 Claims, 5 Drawing Sheets

| | I PEAK (μA) | C (pF) | RAMP SLOPE |
|---|---|---|---|
| $RTD_1$ | 191 | 398 | $1.89 \times 10^5$ V/SEC |
| $RTD_2$ | 199 | 256 | $3.12 \times 10^5$ V/SEC |
| $RTD_3$ | 208 | 120 | $5.33 \times 10^5$ V/SEC |
| $RTD_4$ | 222 | 40 | $6.6 \times 10^5$ V/SEC |

# ELECTRICAL DATA STORAGE DEVICE

This application claims priority under 35 USC §199(c)(1) of provisional application Ser. No. 06/000,800, filed Aug. 05, 1995.

FIELD OF THE INVENTION

This invention relates generally to the field of data storage devices for use in digital circuitry such as computers and the like and particularly to data storage devices which utilize negative impedance devices such as resonant tunneling diodes and the like.

BACKGROUND OF THE INVENTION

Data storage devices for use in computers and the like have, over the years, taken on many forms. Some of the earliest devices used to store data have included magnetic core storage, acoustical delay lines, flip-flops and the like. As semiconductor technology developed, however, semiconductor based storage devices came to be the most common form of data storage device for direct high speed access by computers and other electronic devices requiring high speed data storage.

The needs for data storage devices in electronic computers and other electronic devices seems to be insatiable. Every year, engineers seek to have greater and greater storage devices available. One of the most widely used storage device today is the DRAM (dynamic random access memory) device. Another frequently used storage device is the SRAM (static random access memory) device. These devices usually take the form of a plurality of storage cells arranged in a regular grid pattern on a semiconductor substrate.

As the size of transistors has become smaller, the number of storage locations in each such device has risen with the capacity going up 4 times the capacity of the next earlier generation of storage device. At the present time, devices having a capacity of 64 million bits are being developed while devices with even greater capacity are being contemplated. During the development phase of devices of this and larger capacity, developers increasingly realize that the smaller geometries of semiconductor devices provides significant engineering barriers that have to be overcome before the new product can be manufactured. Indeed, it is generally believed that radically new designs may be needed to meet storage density requirements of the future and that simply making existing designs smaller will not always be a workable plan for future.

OBJECTS OF THE INVENTION

In view of the above mentioned difficulties, it is a primary objective of the present invention to provide a data storage device which will provide a storage capacity which is greater than the capacity achievable by devices already on the market and also greater than the capacity of storage devices soon to be marketed.

It is a further object of this invention to provide a data storage device which will store more data with a device having a given "footprint" than can be stored by currently available devices with the same "footprint."

BRIEF DESCRIPTION OF THE INVENTION

The present invention includes at least two resonant tunneling diodes coupled in series. Each resonant tunneling diode has two stable states and by coupling proper circuitry and signals thereto the individual diodes in the series can be switched from one stable state to a second stable state. This selective switching is accomplished by coupling a capacitor in parallel with each resonant tunneling diode. Thereafter, by applying a ramp voltage, with a given leading edge slope, across the series connected resonant tunneling diodes, any selected one of the diodes can be switched from one stable state to a second stable state. The capacitor size is selected so that a different leading edge slope is required to switch each of the resonant tunneling diodes from one state to another.

BRIEF DESCRIPTION OF THE DRAWINGS

The foregoing and other objects, advantages and features of the present invention are described further below in connection with the drawings wherein.

DETAILED DESCRIPTION

Figure 1:
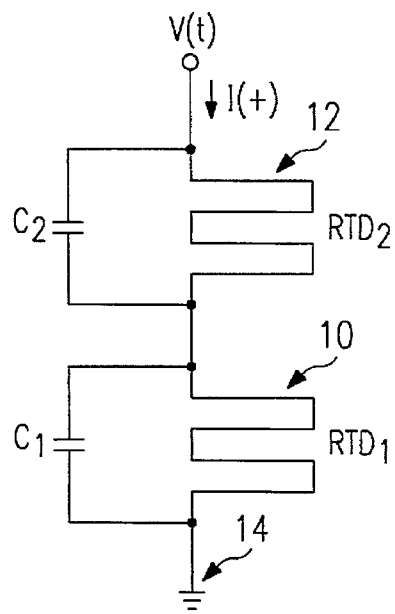
FIG. 1 illustrates a storage device according to the present invention.

Referring first to FIG. 1, a circuit containing two negative resistance elements 10 and 12 are connected in series between a voltage source V(t) and ground 14. Coupled across the two terminals of each negative impedance element 10 and 12 respectively are capacitances $C_1$ and $C_2$ which may respectively comprise simply the capacitance of the negative impedance elements 10 and 12 or may comprise separate capacitances coupled in parallel with elements 10 and 12. In one form, the negative impedance elements 10 and 12 comprise resonant tunneling diodes RTD1 and RTD2 although other negative impedance devices such as tunnel (Esaki) diodes and active circuits having two terminals which exhibit a negative impedance characteristic between those terminals will function as well in accordance with the present invention.

Figure 2:
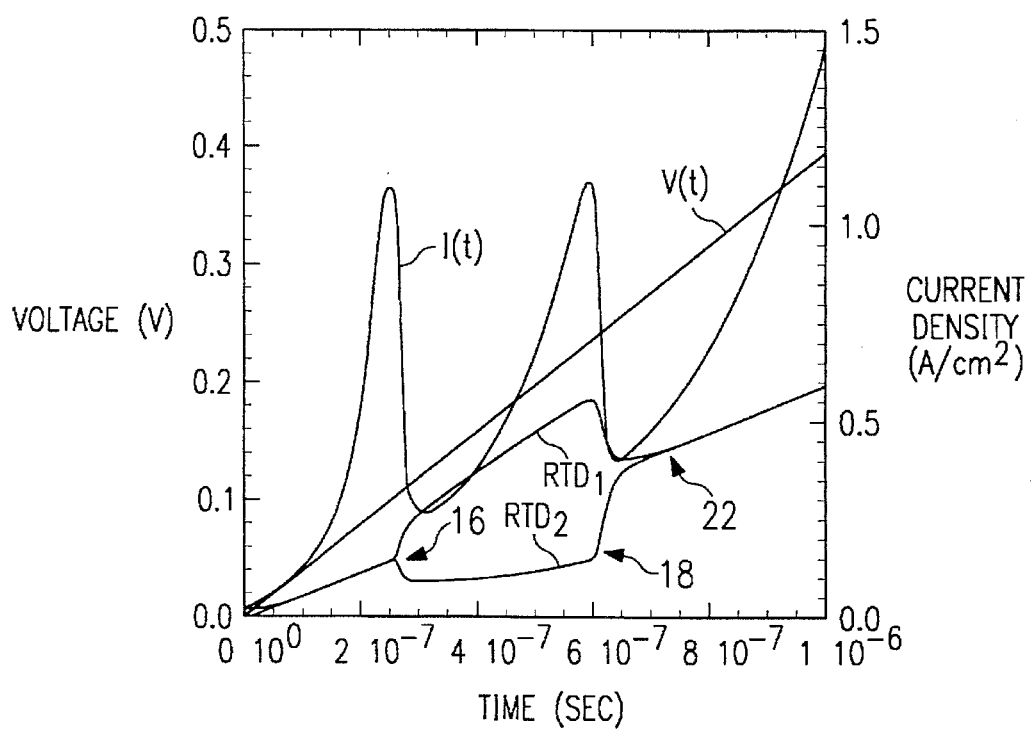
FIGS. 2 illustrates operating characteristics of the circuit illustrated in FIG. 1 with a very slow ramp voltage for the supply V(t)

FIG. 2 illustrates the manner in which the circuit of FIG. 1 functions when a time varying voltage V(t) is applied thereto. In FIG. 2, the voltage V(t) comprises a very slowly rising voltage (a very slow ramp voltage) having a voltage level indicated on the left vertical scale and time indicated along the horizontal scale. As the voltage V(t) gradually rises, the current I(t) varies in accordance with the curve labeled as such in FIG. 2. The level of current is indicated on the right vertical scale.

The circuit of FIG. 2 is designed with the two negative impedance devices (resonant tunneling diodes RTD1 and RTD2) designed to be nominally identical so that the I/V characteristics are nominally identical although one of the diodes will have a lower peak current than the other. For purposes of this explanation, the peak current of RTD1 is assumed to be slightly less than the peak current of RTD2 and is in the order of about 1.1 A cm$^2$ which occurs at about 0.05 volts on the I/V characteristic curve for the RTDs under discussion. Note also that the capacitance of these RTD devices is in the order of about $10^{-7}$ F/cm$^2$. Also note that the intrinsic switching rate of these RTDs is about $10^7$ volts/sec. Accordingly, as the voltage V(t) rises, the current through the two negative impedance devices RTD1 and RTD2 will reach the peak current for RTD1 before reaching the peak current for RTD2. Thus, RTD1 will switch state before RTD2 switches state. This is illustrated generally at 16 where the voltage across RTD1 is about 0.05 and begins to rise rapidly and the voltage across RTD2 begins to fall. At the same time, the current I(t) begins to fall as well. Thereafter, as the voltage V(t) rises further, the voltage across the negative impedance devices RTD1 and RTD2 also rises. When the voltage across RTD2 again reaches about 0.05 volts and the current I(t) is slightly greater than the peak current which caused RTD1 to switch earlier, RTD2 will reach its peak current and begin to switch as illustrated generally at 18. At this point the voltage across RTD2 rises rapidly and the voltage across RTD1 falls until it is about the same across both diodes RTD1 and RTD2. Thereafter, as the voltage V(t) rises, the voltage across each of the diodes RTD1 and RTD2 will rise as well as illustrated generally at 22.

The behavior of the circuit in FIG. 1 is determined, as illustrated above, by peak current of the two negative impedance devices at which they change states. A very slowly rising ramp voltage V(t) will always cause the negative impedance device with the lower peak current to switch first if the current through the negative impedance devices reaches that peak current. Accordingly, the negative impedance devices will switch in a predetermined sequence.

However, it is possible to modify the circuit behavior by changing the ramp voltage V(t) and by selecting appropriate shunt capacitances. In particular, the circuit can be constructed such that RTD1 has the lowest peak current and RTD2 has a higher peak current. If the capacitances are properly selected so that $C_1$ is lower than the capacitance of $C_2$, it is possible to determine which of the diodes RTD1 or RTD2 switches first by selecting the slope of the leading edge of the ramp voltage V(t).

Figure 3A:
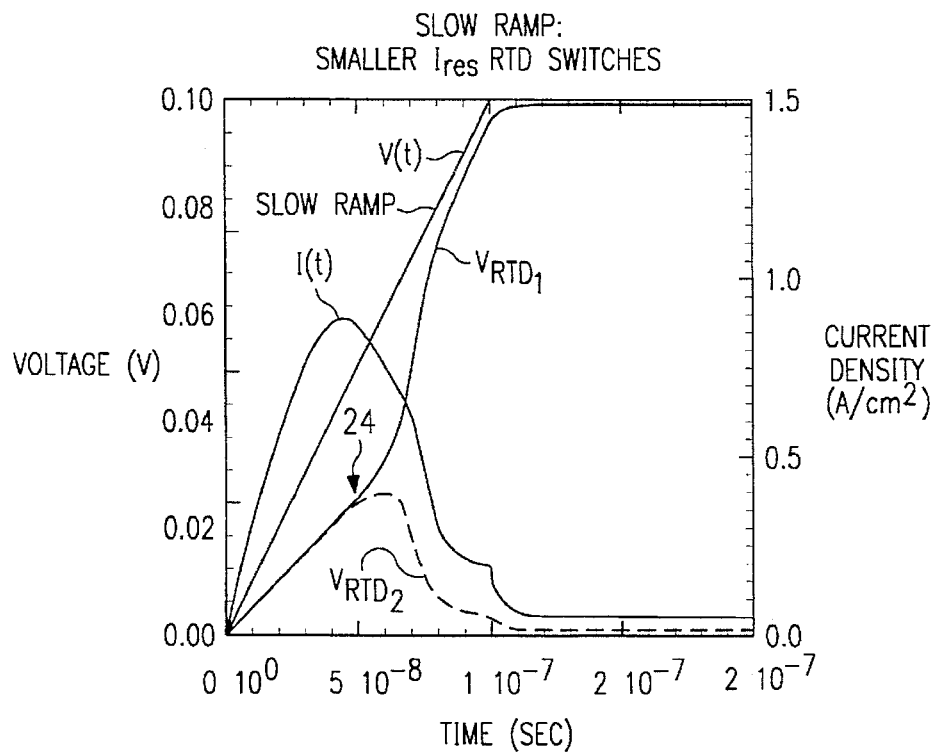
FIGS. 3a and 3b illustrate the operating characteristics of the circuit illustrated in FIG. 1 with respectively a slow ramp and a fast ramp for the supply V(t)
Figure 3B:
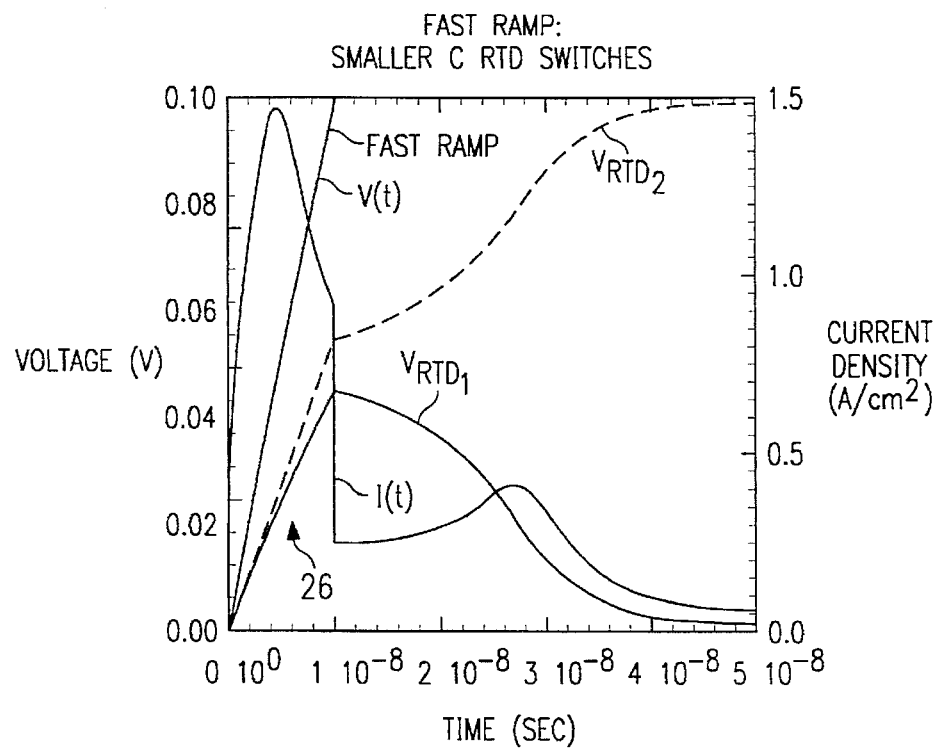

This behavior is illustrated in FIGS. 3a and 3b. In FIG. 3a, a slow ramp voltage V(t) is applied to the two negative impedance devices RTD1 and RTD2 of FIG. 1. In this embodiment, the peak current of RTD1 is about 0.8 A cm$^2$ which occurs at about 0.024 volts. The capacitance of RTD1 and the intrinsic switching speed is the same as set forth above with respect to FIG. 2. The slow ramp voltage rises from 0 volts to 0.1 volts in about $10^{-7}$ seconds and then remains constant at 0.1 volts. When the voltage of the slow ramp is about 0.05 volts (approximately the point at which the peak current for RTD1 is reached), RTD1 starts to change state as indicated at 24. Thereafter, the voltage across RTD1 rises quickly as illustrated by the curve labeled $V_{RTD1}$ and converges on the ramp voltage V(t) while the voltage across RTD2 falls quickly to near zero as indicated by the line labeled $V_{RTD2}$.

In FIG. 3b, the ramp voltage V(t) has a fast ramp which rises from 0 volts to 0.1 volts in about $10^{-8}$ seconds. Due to the speed of rise of the ramp, the voltage across the two diodes RTD1 and RTD2 is not the same, as illustrated at 26. Indeed, since the larger capacitance is in parallel with RTD1, the voltage across RTD1 as illustrated by the curve $V_{RTD1}$ does not rise as quickly as the voltage across diode RTD2 as illustrated by the curve $V_{RTD2}$. As such, the current through RTD2 will reach the peak level at which it will switch state before the current in RTD1 reaches the peak current at which it will switch. Thus the voltage across RTD2 will rise rapidly and converge on that of the voltage V(t) as indicated by the curve $V_{RTD2}$. On the other hand the voltage $V_{RTD1}$ converges on 0.

From the above description of the circuit of FIG. 1 and its operation under different signal inputs and design parameters, it is understood that negative impedance devices can be connected in series and, by selecting the slope of the voltage applied thereto, the specific negative impedance device desired to be switched from one state to another can be controlled. Therefore, it is possible to store data more densely in storage devices characterized by this invention than could be achieved heretofore with series connected negative impedance devices. For example, in prior devices where the number of negative impedance devices controlled the number of states that could be stored therein, the maximum number of states is N+1 where N is the number of negative impedance devices connected in series. For devices characterized by this invention, however, the number of states is $2^N$ where N is the number of negative impedance devices connected together in series.

Figures 4, 5:
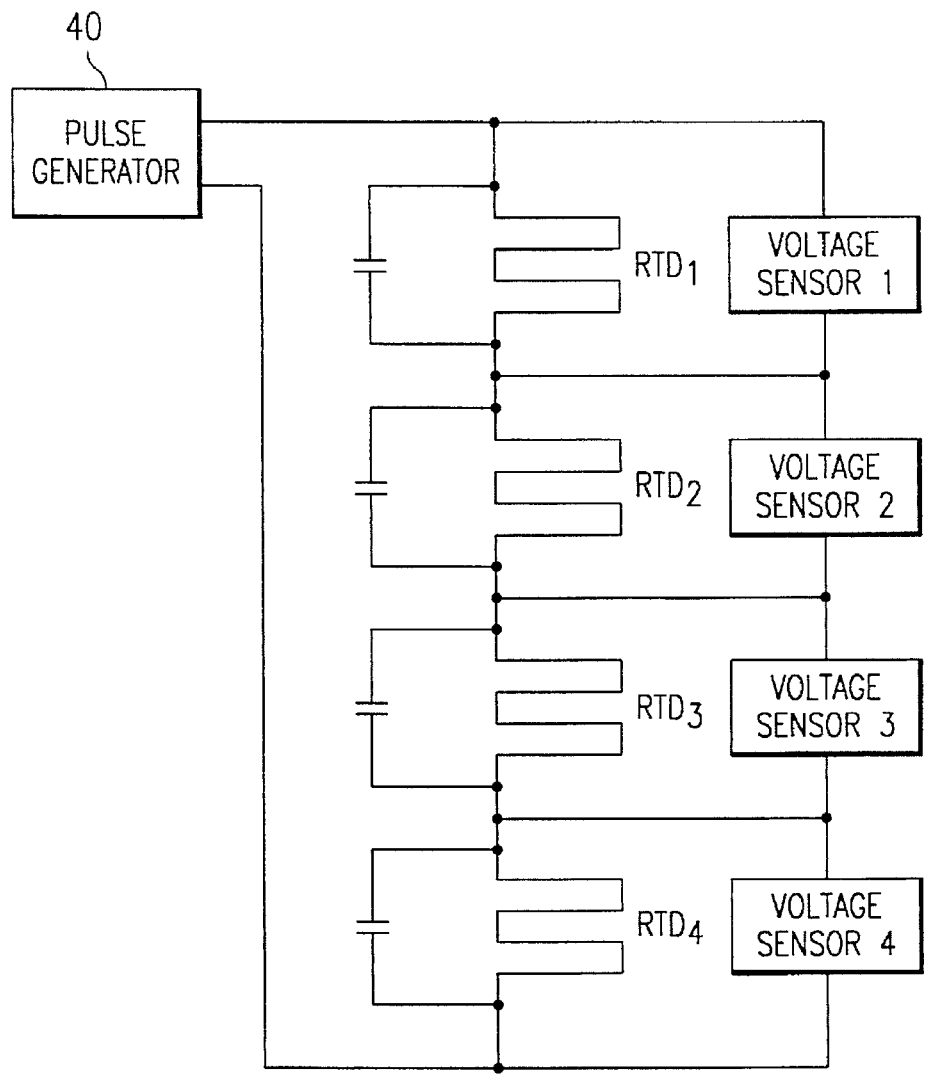
FIG. 4 illustrates a storage device according to the present invention with four negative resistance devices connected in series.
FIG. 5 illustrates some aspects of the device of FIG. 4.

FIG. 4 illustrates a circuit with four negative impedance devices RTD1, RTD2, RTD3 and RTD4 connected in series. A capacitor is coupled in parallel with each negative impedance device. The four series connected negative impedance devices are powered by a pulse generator 40. The negative impedance devices are preferably resonant tunneling diodes which have peak currents $I_{peak}$ as identified in FIG. 5. For convenience, the negative impedance devices are arranged from top to bottom in FIG. 4 in ascending order for peak currents. This arrangement of the negative impedance devices, however, is not necessary. They can be arranged in any order; however, the capacitance, as indicated in FIG. 5, must be connected across the indicated negative impedance device. In particular, it is to be noted that the diode with the lowest peak current has the highest capacitance across it. The diode with the highest peak current has the smallest capacitance across it. The diodes having peak currents intermediate the two extremes also have capacitors across them as well in an ascending order for diodes having peak currents arranged in descending order as indicated in FIG. 5.

Selected ones of the negative impedance devices in FIG. 4 can be switched from one state to another by simply applying a ramp signal from the pulse generator 40 which has a ramp slope substantially as indicated in FIG. 5. For example, if one desired to switch RTD3, a ramp with a slope of about $5.33 \times 10^5$ volts/sec can be applied to the four series connected negative impedance devices of FIG. 4. Ramp slope accuracy is not critical, however. Assuming the ramp has a maximum voltage of about 0.6 volts (about 4 times the peak voltage), only RTD3 will switch to a state of operation where the $I_{peak}$ for that diode has been exceeded. If a different negative impedance device is desired to be switched, the pulse generator 40 need only produce a ramp having the slope indicated in FIG. 5 with an amplitude sufficient to assure that the $I_{peak}$ for the negative impedance device desired to be switched is exceeded.

In the event that more than one negative impedance device is desired to be switched from an initial stable state to another stable state, the pulse generator 40 needs to produce a different ramp. To switch the first negative impedance, the generator 40 produces a ramp in the manner discussed above starting at 0 volts and rising to about 0.6 volts at the slope associated with the first negative impedance device to be switched. Then, the pulse generator 40 produces a second pulse starting at about 0.6 volts and rising to about 0.8 volts at the slope associated with the second negative impedance device to be switched. Those of skill in the art will recognize that these voltage values depend somewhat on the particular I-V curve for the RTDs used and that different values would be expected for RTDs different from those described herein.

The advantage of achieving greater storage density with the present invention as compared to prior art devices using series connected resonant tunneling diodes is clear from the above description of the operation of the circuit in FIG. 4. In prior art devices with four series connected negative impedance devices, 5 stable states will exist while in the present invention, 16 stable states exist.

As illustrated in FIG. 4, the state of each of the resonant tunneling diodes can be individually sensed by a voltage sensor. For example, voltage sensor 1 is coupled across the resonant tunneling diode RTD1 and serves to measure the voltage thereacross. When the measured voltage is low (about 0.05 volts), the diode RTD1 is operating at a stable point below the peak current on its I/V curve. However, when the measured voltage is higher (about 0.25 volts), the diode RTD1 is operating at a stable point above the peak current point on its I/V curve.

Figure 6:
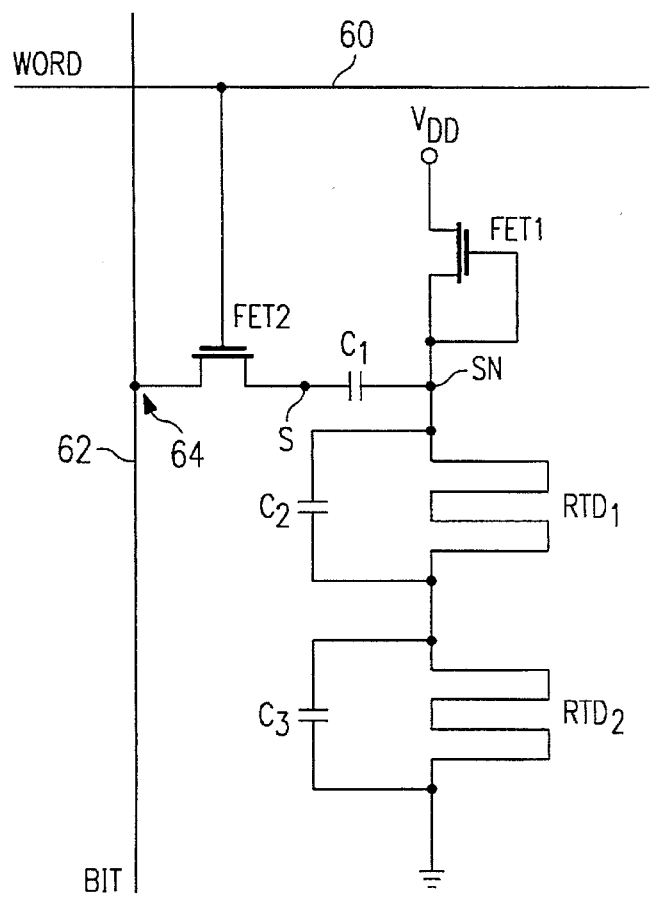
FIG. 6 illustrates the circuit diagram of a cell within an array of cells utilizing the present invention.

Referring now to FIG. 6, a circuit diagram of a multi-bit cell within an array of cells of a data storage device utilizing the present invention is illustrated. The circuit includes a pair of resonant tunneling diodes RTD1 and RTD2 connected in series between a storage node SN and ground. The peak current for the diode RTD1 is lower than the peak current for the diode RTD2. This multi-bit cell can store two data bits with 4 different binary values. According to the principals of this invention, however, a multi-bit cell may have more than two resonant tunneling diodes in which case each cell can store $2^N$ different binary values where N is the number of tunneling diodes coupled in series within the cell.

A capacitor C2 is connected across the terminals of diode RTD1 while another capacitor C3 is connected across the terminals of diode RTD2. In accordance with the principals set forth above, the capacitance of capacitor C2 is greater than the capacitance of capacitor C3. When the cell contains more than two diodes in series, as noted above, the diode with the lowest peak current has the largest capacitance coupled thereacross while the diode with the highest peak current has the smallest capacitance coupled thereacross.

The storage node SN is coupled by a depletion mode FET (FET1) to a voltage source $V_{DD}$. This voltage source for the very low current diodes RTD1 and RTD2 is dependent on the RTDs used and, in the case of the RTDs of the type in FIG. 4, the approximate source voltage is about 0.7 volts. The gate of the transistor FET1 is coupled to the source thereof. In operation, the transistor FET1 is operated in its saturation mode so that it acts very much like a constant current source. As such, the diodes RTD1 and RTD2 can be operated at each of the four stable operating points for these two series connected diodes. The first state occurs when both RTD1 and RTD2 are operating on a point on their I/V characteristics curve which is below the peak current at which either diode changes state. The second state occurs when RTD1 is operating at a point where the peak current thereof has been exceeded during ramping while the peak current for RTD2 has not been exceeded. The third state occurs when RTD2 is operating at a point where the peak current thereof has been exceeded during ramping while the peak current for RTD1 has not been exceeded. The fourth state occurs when both RTD1 and RTD2 are operating at a point where each of their peak currents have been exceeded.

The circuitry for selectively causing one of the diodes RTD1 or RTD2 to change state consists of the Word line 60, the Bit line 62, transistor FET2 and a decoupling capacitor C1. The decoupling capacitor C1 is connected between the transistor FET2 at node S and the storage node SN. The capacitance of C1 is typically 5 to 10 times larger than the capacitance of either C2 or C3. Capacitor C1 serves to DC isolate the storage node SN from the node S while permitting AC signals at node S to be coupled to the storage node SN. The transistor FET2 has its gate coupled to the Word line 60 while its source/drain is coupled at 64 to the Bit line 62.

Figure 8:
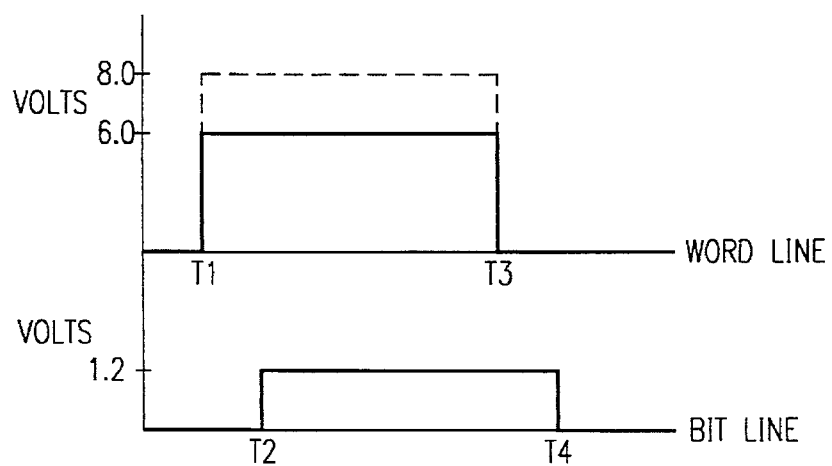
FIG. 8 illustrates a timing diagram for the Bit and Word lines for the circuit of FIG. 6.
Figure 7A:
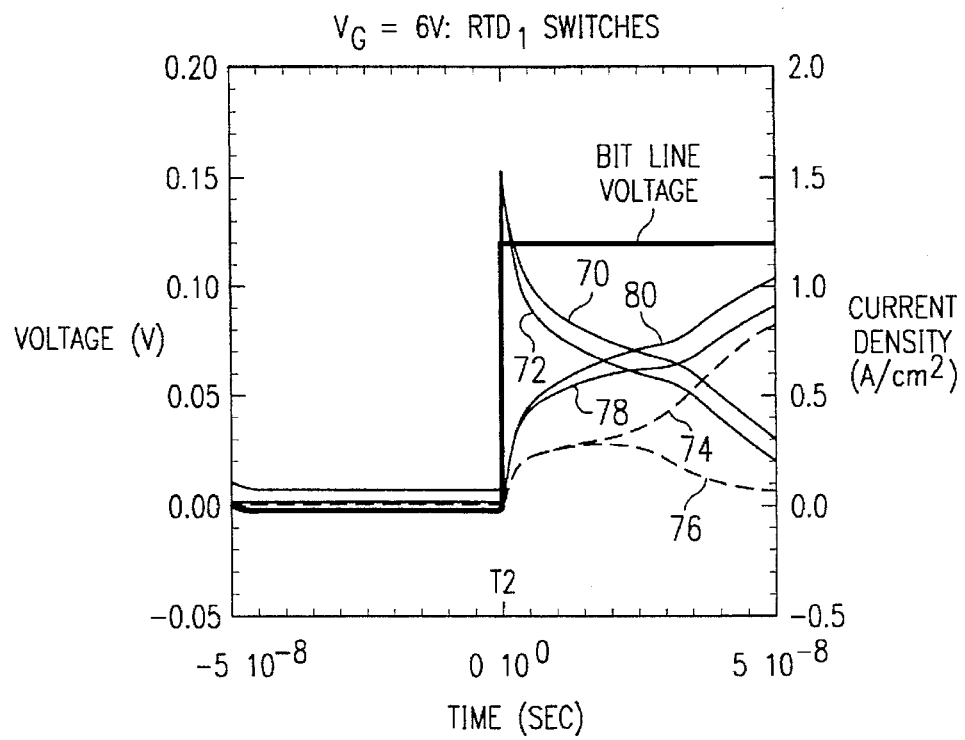
FIG. 7a and 7b illustrate the manner in which the circuit elements of FIG. 6 operate.
Figure 7B:
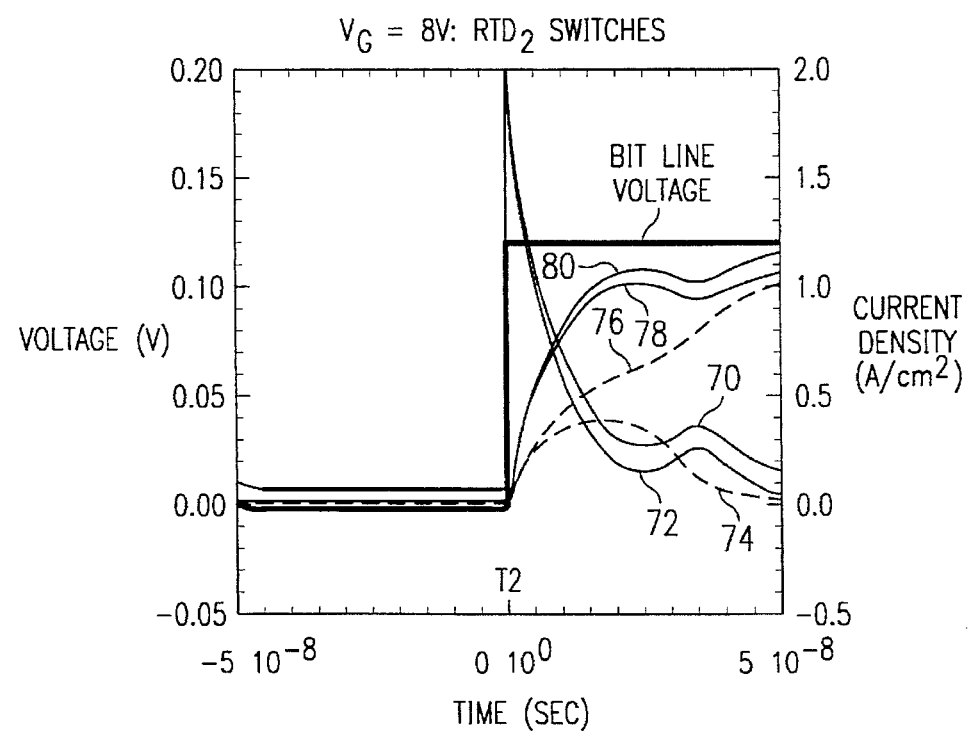

The operation of the circuitry of FIG. 6 is illustrated in FIGS. 7a, 7b and 8. The time sequence of the signals in FIG. 8 is necessary to prevent to prevent changes on the Bit line 62 and word line 60 from causing undesired state changes in the diodes RTD1 and RTD2. As illustrated in FIG. 8, when data is being stored into the diodes RTD1 and RTD2, the Word line 60 is first raised to one of two voltage levels. For the low current diodes RTD1 and RTD2, the voltage on the Word line 60 rises to either 6 or 8 volts at time T1. Subsequently at time T2, the Bit line 62 is raised to about 0.12 volts. This condition persists until time T3 whereat the Word line 60 is dropped to 0 volts. Thereafter, at time T4, the Bit line 62 is dropped to 0 volts as well.

FIG. 7a illustrates the manner in which the circuit of FIG. 6 functions in response to the Word line 60 placing a voltage of 6 volts onto the gate of transistor FET2. This condition is assumed to exist for the whole of the time periods shown in FIG. 7a. At time T2, the bit line voltage jumps from 0 to 0.12 volts. Thereafter, the current through the series connected diodes RTD1 and RTD2 jumps and then falls off as illustrated by the curve 70. The current through the pass gate transistor FET2 is illustrated by the curve 72. The voltage across the diode RTD1 is illustrated by curve 74 while the voltage across diode RTD2 is illustrated by curve 76. The voltage at node NS is illustrated by line 78 while the voltage at node S is illustrated by line 80. Thus it is seen that if a voltage of 6 volts is applied to the gate of transistor FET2, the state of diode RTD1 changes from a stable point on its IN curve below the peak current to one above the peak current.

The function of the circuit of FIG. 6 when the voltage on Word line 60 is 8 volts is illustrated by the curves of FIG. 7b. Here as with FIG. 7a, the voltage on line 60 is assumed to be constant for the whole time period illustrated and at a level of 8 volts. The change in the shape of voltage curves 80, 78, 76 and 74 is evident and in particular, the curves of FIG. 7b react in much less time than is illustrated in FIG. 7a. In addition, it is evident that voltage on the gate of diode RTD2 has caused diode RTD2 to change state while diode RTD1 does not change state. The reason for the voltages on the gate of transistor FET2 causing such different behavior is due to the fact that the AC voltage coupled to node SN has a different slope when the gate voltage is 8 volts than it does when the gate voltage is 6 volts. The fact that the AC voltage at node SN has a different slope is responsible, as illustrated earlier herein, for determining which of the diodes RTD1 or RTD2 switches state. From this description, it will be clear to those of skill in the art that if one wished to switch both resonant tunneling diodes within a cell from their below peak current stable state to their above peak current stable state, the circuit of FIG. 6 must be first operated with a word line voltage of 6 volts to switch RTD1 and then operate it again with the word line voltage at 8 volts to switch RTD2.

Accordingly, each resonant tunneling diode within a cell which is used to store a data bit must be actuated individually in order to switch its state from that below the peak current to the state above the peak current.

It will be recognized by those of skill in the art that in making devices according to this invention, some experimentation is needed to define the exact parameters needed for producing an operational device. In particular, attention must be paid to the peak current through and the capacitance across each negative impedance device. Attention must also be paid to the slope (slew rate) of the leading edge of the AC signal applied to the series connected negative impedance devices for these are the parameters which control the ability of the system to permit changing the operating point of one selected negative impedance device in the string of series connected negative impedance devices.

While the above description of the invention has been made with particular emphasis on the structures illustrated in the drawings herein, those of skill in the art will recognize that the above mentioned and other modifications may be made to the illustrated embodiments without departing from the spirit and scope of this invention as defined in the following claims.

What is claimed is:

1. An electrical data storage device comprising:
    a first negative impedance device having a first peak current whereat said first negative impedance device switches from one stable state to another stable state;
    a second negative impedance device connected in series with said first negative impedance device, said second negative impedance device having a second peak current whereat said second negative impedance switches from one stable state to another stable state, said second peak current being greater than said first peak current;
    a first capacitance coupled across said first negative impedance device;
    a second capacitance coupled across said second negative impedance device, the magnitude of said second capacitance being smaller than the magnitude of said first capacitance; and
    a power source coupled across said first and second negative impedance devices for producing a ramp voltage with one of two different slopes for the leading edge of said ramp voltage, the first slope being operative to switch said first negative impedance device and the second slope being operative to switch said second negative impedance device.

2. The electrical data storage device of claim 1 wherein said first and second negative impedance devices each comprise a resonant tunneling diode.

3. The electrical data storage device of claim 1 additionally including a first voltage sensor across said first negative impedance device for sensing the voltage thereacross and a second voltage sensor across said second negative impedance device for sensing the voltage thereacross.

4. An electrical data storage device comprising:
    at least two negative impedance devices coupled in series, each negative impedance device having a different peak current whereat said negative impedance device switches state; and
    a capacitance coupled across each said negative impedance device, the negative impedance device having the lowest peak current having the greatest capacitance thereacross and the negative impedance device having the highest peak current having the smallest capacitance thereacross.

5. The data storage device of claim 4 wherein each said negative impedance device comprises a resonant tunneling diode.

6. The storage device of claim 4 additionally comprising a power source coupled across said series connected negative impedance devices, said power source producing a step-like voltage across said negative impedance devices including a leading edge which has a slope selected to switch a unique one of said series connected negative impedance devices.

7. The storage device of claim 4 additionally including a plurality of voltage sensors, each coupled across a unique one of said negative impedance devices to detect the state of each said negative impedance device.

8. The storage device of claim 4 additionally comprising a power source coupled across said series connected negative impedance devices to produce a staircase voltage where each step of said staircase voltage has a different slope for its leading edge which is selected to switch a unique one of said negative impedance devices.

9. The storage device of claim 4 additionally comprising a power source coupled across said series connected negative impedance devices to produce a DC component sufficient to maintain each negative impedance device at its operating state and to produce an AC component to selectively switch the operating state of and selected negative impedance device from a state below its peak current point on its I/V curve to a point above its peak current on its I/V curve.

10. An electrical data storage device comprising:
    at least two negative impedance devices coupled in series, each negative impedance device having a different peak current whereat said negative impedance device switches between two stable states;
    a capacitance coupled across each said negative impedance device with no two capacitances being the same, the capacitances being arranged so that the negative impedance device having the lowest peak current has the greatest capacitance thereacross and the negative impedance device having the highest peak current has the smallest capacitance thereacross; and
    a power source coupled across said series connected negative impedance devices supply DC power to maintain said series connected negative impedance devices at any one of the stable states thereof and to selectively supply an AC power pulse to said series connected negative impedance devices having a selected slope for the leading edge thereof to switch a selected one of said negative impedance devices from a first state on the IN curve thereof below the peak current point to a second state on the IN curve above the peak current point.

11. The storage device of claim 10 wherein the negative impedance device controlled by said AC power is selected by the slope of the AC power supplied thereto.

12. The storage device of claim 10 wherein said negative impedance devices each comprise a resonant tunneling diode.

13. The storage device of claim 10 additionally including a plurality of voltage sensors, each coupled across a unique one of said negative impedance devices to the state of each said negative impedance device.

14. The storage device of claim 1 wherein each said capacitance comprise the capacitance of each said negative impedance device.

15. The storage device of claim 4 wherein each said capacitance comprises the capacitance of the negative impedance device itself.

16. The storage device of claim 10 wherein each said capacitance comprises the capacitance of the negative impedance device itself.

17. An electrical data storage device comprising:

at least two negative impedance devices coupled in series, each negative impedance device having a different peak current whereat said negative impedance device switches between two stable states;

a capacitance coupled across each said negative impedance device with no two capacitances being the same, the capacitances being arranged so that the negative impedance device having the lowest peak current has the greatest capacitance thereacross and the negative impedance device having the highest peak current has the smallest capacitance thereacross; and a current source coupled in series with said series connected negative impedance devices supply DO power to maintain said series connected negative impedance devices at any one of the stable states thereof; and an AC power supply to said series connected negative impedance devices at the point of connection with said current source, said AC power supply producing a pulse having a selected slope for the leading edge thereof to switch a selected one of said negative impedance devices from a first state on the I/V curve thereof below the peak current point to a second state on the IN curve above the peak current point.

18. The storage device of claim 17 wherein said AC power supply includes an isolation capacitor coupled at one lead thereof to the connection point between said series connected negative impedance devices and said current source, the other lead of said capacitor being coupled to a node; a word line and a bit line, said word line for receiving a pulse beginning at time T1 and ending at time T3 having one of n voltages thereon where n is the number of negative impedance devices in said storage device, said bit line for receiving a pulse beginning at time T2 and ending at time T4 where T1<T2<T3<T4; and a FET transistor with a gate and two controlled leads, said gate being coupled to said word line, one said controlled lead is coupled to said bit line and said other controlled lead is coupled to said node.

19. The storage device of claim 18 wherein said negative impedance devices each comprise a resonant tunneling diode.

20. The storage device of claim 18 additionally including a plurality of voltage sensors, each coupled across a unique one of said negative impedance devices to determine the state of each said negative impedance device.

21. The storage device of claim 17 wherein each said capacitance comprises the capacitance of each said negative impedance device.

22. The storage device of claim 18 wherein each said capacitance comprises the capacitance of the negative impedance device itself.

23. The data storage device of claim 4 wherein each said negative impedance device comprises a tunnel diode.

24. The data storage device of claim 10 wherein each said negative impedance device comprises a tunnel diode.

25. The data storage device of claim 1 wherein each said negative impedance device comprises a tunnel diode.

\* \* \* \* \*